United States Patent
Volkova et al.

(10) Patent No.: US 11,322,652 B2
(45) Date of Patent: May 3, 2022

(54) METHODS FOR PRODUCING COMPOSITE GAN NANOCOLUMNS AND LIGHT EMITTING STRUCTURES MADE FROM THE METHODS

(71) Applicant: Ostendo Technologies, Inc., Carlsbad, CA (US)

(72) Inventors: Anna Volkova, Gaithersburg, MD (US); Vladimir Ivantsov, Oceanside, CA (US); Alexander Syrkin, Oceanside, CA (US); Benjamin A. Haskell, Carlsbad, CA (US); Hussein S. El-Ghoroury, Carlsbad, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 15/377,775

(22) Filed: Dec. 13, 2016

(65) Prior Publication Data
US 2017/0170363 A1    Jun. 15, 2017

Related U.S. Application Data

(60) Provisional application No. 62/267,117, filed on Dec. 14, 2015.

(51) Int. Cl.
*H01L 31/18*   (2006.01)
*H01L 33/18*   (2010.01)
(Continued)

(52) U.S. Cl.
CPC ............ *H01L 33/32* (2013.01); *C30B 29/406* (2013.01); *C30B 29/607* (2013.01); *C30B 29/62* (2013.01);
(Continued)

(58) Field of Classification Search
CPC .......... H01L 21/0254; H01L 21/02603; H01L 21/20; H01L 31/1852; H01L 33/007;
(Continued)

(56) References Cited

U.S. PATENT DOCUMENTS

| 7,745,315 B1 | 6/2010 | Wang et al. |
| 7,982,208 B2 * | 7/2011 | Craven ............... H01L 21/0242 257/14 |

(Continued)

FOREIGN PATENT DOCUMENTS

| KR | 10-2015-0097182 | * | 8/2015 | ............. H01L 33/20 |
| KR | 10-2140741 | * | 8/2020 | ............. H01L 33/20 |

(Continued)

OTHER PUBLICATIONS

"International Search Report and Written Opinion of the International Searching Authority dated Feb. 24, 2017; International Application No. PCT/US2016/066729", Feb. 24, 2017.

(Continued)

*Primary Examiner* — Mary A Wilczewski
(74) *Attorney, Agent, or Firm* — Greg Caldwell, Esq.; W. Eric Boyd, Esq.

(57) ABSTRACT

A method for growing on a substrate strongly aligned uniform cross-section semiconductor composite nanocolumns is disclosed. The method includes: (a) forming faceted pyramidal pits on the substrate surface; (b) initiating nucleation on the facets of the pits; and; (c) promoting the growth of nuclei toward the center of the pits where they coalesce with twinning and grow afterwards together as composite nanocolumns. Multi-quantum-well, core-shell nanocolumn heterostructures can be grown on the sidewalls of the nanocolumns. Furthermore, a continuous semiconductor epitaxial layer can be formed through the overgrowth of the (Continued)

nanocolumns to facilitate fabrication of high-quality planar device structures or for light emitting structures.

22 Claims, 7 Drawing Sheets

(51) Int. Cl.
| | |
|---|---|
| H01L 33/24 | (2010.01) |
| H01L 33/32 | (2010.01) |
| H01L 21/20 | (2006.01) |
| H01L 33/00 | (2010.01) |
| H01L 33/08 | (2010.01) |
| H01L 33/06 | (2010.01) |
| H01L 31/0352 | (2006.01) |
| H01L 31/109 | (2006.01) |
| H01L 21/02 | (2006.01) |
| C30B 29/66 | (2006.01) |
| C30B 29/62 | (2006.01) |
| C30B 29/40 | (2006.01) |
| C30B 29/60 | (2006.01) |

(52) U.S. Cl.
CPC .......... *C30B 29/66* (2013.01); *H01L 21/0254* (2013.01); *H01L 21/02603* (2013.01); *H01L 21/20* (2013.01); *H01L 31/035236* (2013.01); *H01L 31/035281* (2013.01); *H01L 31/109* (2013.01); *H01L 31/1848* (2013.01); *H01L 31/1852* (2013.01); *H01L 33/007* (2013.01); *H01L 33/06* (2013.01); *H01L 33/08* (2013.01); *H01L 33/18* (2013.01); *H01L 33/24* (2013.01); *Y02E 10/544* (2013.01)

(58) Field of Classification Search
CPC ............ H01L 33/32; H01L 31/035227; H01L 31/035236; H01L 31/035281; H01L 31/109; H01L 31/1848; H01L 33/06; H01L 33/08; H01L 33/18; H01L 33/24; C30B 29/406; C30B 29/62; C30B 29/66; C30B 29/607; H01J 1/308; Y02E 10/544
See application file for complete search history.

(56) References Cited

U.S. PATENT DOCUMENTS

| | | | |
|---|---|---|---|
| 8,338,818 B1 | 12/2012 | Hersee | |
| 8,410,496 B2 | 4/2013 | Hersee et al. | |
| 8,658,519 B1* | 2/2014 | Hersee | H01L 21/02439 257/12 |
| 2006/0272572 A1* | 12/2006 | Uematsu | C30B 25/18 257/E21.127 |
| 2007/0037308 A1* | 2/2007 | Okuyama | H01L 33/007 257/E33.033 |
| 2008/0303042 A1* | 12/2008 | Minato | H01L 33/20 257/E33.006 |
| 2009/0079034 A1* | 3/2009 | Wang | H01L 21/02609 257/615 |
| 2010/0207097 A1* | 8/2010 | Oh | H01L 33/18 438/46 |
| 2012/0001153 A1 | 1/2012 | Hersee et al. | |
| 2012/0225526 A1* | 9/2012 | Hersee | B82Y 10/00 438/172 |
| 2012/0264246 A1* | 10/2012 | Peng | H01L 33/32 257/E21.113 |
| 2014/0138620 A1* | 5/2014 | Svensson | H01L 33/007 257/13 |
| 2014/0176942 A1* | 6/2014 | Bratkovski | G01N 21/658 356/301 |
| 2014/0252308 A1 | 9/2014 | Peng et al. | |
| 2015/0001556 A1* | 1/2015 | Kim | H01L 33/007 428/141 |
| 2015/0035071 A1 | 2/2015 | Ching et al. | |
| 2015/0035428 A1* | 2/2015 | Sun | H01J 9/025 313/352 |
| 2015/0124076 A1* | 5/2015 | Hersee | G02B 21/002 348/79 |
| 2016/0020302 A1* | 1/2016 | Chen | H01L 21/02639 438/268 |
| 2017/0101723 A1* | 4/2017 | Hyot | H01L 31/03044 |

FOREIGN PATENT DOCUMENTS

| | | | | |
|---|---|---|---|---|
| TW | 200924029 A | | 6/2009 | |
| TW | 201312096 A | | 3/2013 | |
| TW | 201530807 A | | 8/2015 | |
| WO | 2014138904 A1 | | 9/2014 | |
| WO | WO 2017/106387 | * | 6/2017 | ............ H01L 21/20 |

OTHER PUBLICATIONS

Han, Weiqiang et al., "Synthesis of Galium Nitride Nanorods Through a Carbon Nanotube-Confined Reaction", Science, vol. 277, Aug. 29, 1997, pp. 1287-1289.
Hersee, Stephen D. et al., "The Controlled Growth of GaN Nanowires", Nano Letters, vol. 6, No. 8, Jul. 26, 2006, pp. 1808-1811.
Kim, Hwa-Mok et al., "Growth and characterization of single-crystal GaN nanorods by hydride vapor phase epitaxy", Applied Physics Letters, vol. 81, No. 12, Sep. 16, 2002, pp. 2193-2195.
Kim, Hwa-Mok et al., "Growth of GaN Nanorods by Hydride Vapor Phase Epitaxy Method", Advanced Materials, vol. 14, No. 13-14, Jul. 4, 2002, pp. 991-993.
Kim, Hwa-Mok et al., "High-Brightness Light Emitting Diodes Using Dislocation-Free Indium Gallium Nitride-Gallium Nitride Multiquantum-Well Nanorod Arrays", Nano Letters, vol. 4, No. 6, May 19, 2004, pp. 1059-1062.
Kim, Hwa-Mok et al., "Structural and Cathodoluminescence Properties of Gallium Nitride Nanorods by HVPE", Journal of the Korean Physical Society, vol. 42, Feb. 2003, pp. S222-S225.
Pearton, S. J. et al., "GaN, ZnO and InN Nanowires and Devices", Journal of Nanoscience and Nanotechnology, vol. 8, No. 1, 2008, pp. 99-110.
Peng, H. Y. et al., "Control of growth orientation of GaN nanowires", Chemical Physics Letters, vol. 359, Jun. 20, 2002, pp. 241-245.
Notice of Allowance for Japanese Patent Application No. 2018-549432, dated Aug. 17, 2021, 1 page.
Notice of Allowance for Taiwan Patent Application No. 105141477, dated May 31, 2021, 3 pages.
Notice of Reasons for Refusal for Japan Patent Application No. 2018-549432, dated Dec. 22, 2020, 3 pages.
Office Action for Taiwan Patent Application No. 105141477, dated Sep. 4, 2020, 6 pages.

* cited by examiner

METHODS FOR PRODUCING COMPOSITE GAN NANOCOLUMNS AND LIGHT EMITTING STRUCTURES MADE FROM THE METHODS

CROSS-REFERENCE TO RELATED APPLICATIONS

This application claims the benefit of U.S. Provisional Patent Application No. 62/267,117 filed Dec. 14, 2015.

BACKGROUND OF THE INVENTION

1. Field of the Invention

The invention relates generally to semiconductor materials and devices. More particularly, the invention relates to methods for producing nonpolar semiconductor nanocolumns for use in optoelectronic and other applications.

2. Prior Art

Semiconductor nanostructures emerged more than two decades ago, not only as an object for study in a quantum laboratory but as a step in the search for approaches to device integration to further extend their operational functionality. Among various semiconductor nanostructures, one-dimensional (1D) nanocolumns (e.g., nanowire and nanowhiskers) are exceptionally attractive for use in a variety of applications due to the presence of a single unconfined direction suitable for electrical conduction rather than tunneling.

Compared to two-dimensional layers, one-dimensional nanocolumn geometry offers advantageous lateral strain relaxation on a load-free surface whose function is particularly important as a stress-relief path in high lattice mismatch heterostructures.

Nanocolumns fabricated of GaN and related III-nitride compounds promise a wide range of applications from optoelectronics (solar cells, novel light-emitting and laser diodes) to high-frequency electronics (terahertz emitters, high electron mobility transistors and Gunn-diodes). Ultrasmall resonators and chemical sensors as well as nanowire-based devices that facilitate high-speed optical communication are anticipated using these or similar structures (see S. J. Pearton, B. S. Kang, B. P. Gila, D. P. Norton, O. Kryliouk, F. Ren, Young-Woo Heo, Chih-Yang Chang, Gou-Chung Chi, Wei-Ming Wang, and Li-Chyong Chen, GaN, ZnO and InN Nanowires and Devices, J. Nanosci. Nanotechnol. 8 (2008) 99-110).

Starting from the growth inside carbon nanotubes (see W. Han, S. Fan, Q. Li, and Y. Hu, Synthesis of Gallium Nitride Nanorods through a Carbon Nanotube-Confined Reaction, Science 277, 1287 (1997)), 1D GaN nanostructures have been synthesized using various methods. The catalytic chemical-vapor-deposition (Cat-CVD) on catalyst-coated substrates is most commonly used. In the Cat-CVD process, gaseous reactants undergo dissolution in nanoscale liquid droplets up to their supersaturation and subsequent droplet-restricted GaN growth occurs through the vapor-liquid-solid (VLS) mechanism. Column growth is usually performed on sapphire, SiC or Si substrates with Au, Ni, Fe or In as a metal catalyst material.

In U.S. Pat. No. 7,745,315 a method is disclosed for forming vertically aligned nanowires on a substrate using a monolayer of metal atoms to form uniformly-sized metal islands serving as catalysts for metal organic chemical vapor deposition (MOCVD) of Group III nitride nanowires. The method comprises depositing catalyst metal atoms on a surface of a crystallographic template substrate; heating the crystallographic template to induce surface diffusion of the catalyst metal atoms to form a plurality of metal nanoclusters; and reacting gallium and nitrogen precursor molecules at the metal nanoclusters to form vertically-oriented, single-crystal GaN nanowires that are epitaxially aligned with the crystallographic template substrate. A greater-than-unity ratio of nitrogen to gallium precursors is described. While this is considered commonplace for the growth of continuous epilayers, it is not equally obvious for the growth of nanostructured materials. Despite any advantage of this method in decreasing nanowire diameter down to few nanometers, it suffers from at least two major drawbacks. First, it is virtually impossible to control the spontaneous evolution of the catalyst nanoclusters that eventually define the distribution and cross-section of the nanowires. Second, the common disadvantage of the VLS "bottom-up" growth is the potential contamination of the nanowire by the metal-catalyst that has a finite and non-zero partition coefficient in the semiconductor due to metal remnants left behind in the material after the growth.

In U.S. Pat. No. 8,410,496 a catalyst-free method for creating GaN nanowires by a mask-assisted MOCVD technique is described. In the described method, a mask for selective nano-wire growth is formed over a substrate. This selective growth mask includes a plurality of patterned apertures, exposing portions of the substrate. A semiconductor material is first grown inside the openings of the mask using a selective and so-called "non-pulsed growth" mode. Then, above the mask, the growth continues in a pulsed mode. During the pulsed growth mode, the Group III and Group V precursors are alternately introduced. By continuing the pulsed growth mode, Group-III nitride nanowires extend over a top of the mask along a single direction and maintain a cross-sectional feature of the openings.

A major disadvantage of the aforementioned method is its extreme sensitivity to the parameters of the pulsed growth mode. It has been determined that the timing of the changeover from regular to pulsed MOCVD growth is particularly critical in the described process (see S. D. Hersee, X. Sun, and X. Wang, The Controlled Growth of GaN Nanowires, Nano Lett., 6 (2006) 1808-1811). If the non-pulsed regime is maintained, as soon as the nanowires emerge from the growth mask, lateral growth begins to occur and the nanowire geometry is lost. The duration of the steps within the pulse sequence is also found to be critical, and therefore must be optimized for different growth reactor configurations.

In a series of academic works (see H. M. Kim, D. S. Kim, D. Y. Kim, T. W. Kang, Y. H. Cho, K. S. Chung, Growth and Characterization of Single-crystal GaN Nanorods by Hydride Vapor Phase Epitaxy, Appl. Phys. Lett. 81, No. 12 (2002) 2193-2195; H. M. Kim, D. S. Kim, Y. S. Park, D. Y. Kim, T. W. Kang, K. S. Chung, Growth of GaN Nanorods by a Hydride Vapor Phase Epitaxy Method, Adv. Mater. 14, No. 13-14 (2002) 991-993; H. M. Kim, D. S. Kim, D. Y. Kim, T. W. Kang, K. S. Chung, Structural and Cathodoluminescence Properties of Gallium Nitride Nanorods by HVPE, J. Korean Phys. Soc. 42 (2003) S222-S225; H. M. Kim, Y. H. Cho, H. Lee, S. I. Kim, S. R. Ryu, D. Y. Kim, T. W. Kang, K. S. Chung, High-Brightness Light Emitting Diodes Using Dislocation-Free Indium Gallium Nitride/Gallium Nitride Multiquantum-Well Nanorod Arrays, Nano Lett. 2004, 4, 1059-1062), a catalyst and mask-free method for the growth of GaN and InGaN/GaN nanorods and nanorod arrays by a hydride vapor phase epitaxy (HVPE) technique has been described. The growth is performed in a horizontal reactor on 2-inch sapphire substrates at temperature of about 480° C. During the growth process, the GaCl precursor is synthesized in the source area of the reactor at 750° C., via the reaction of HCl gas with Ga metal. It is transported to the growth area of the reactor by nitrogen carrier gas. There, GaCl is mixed together with the gaseous ammonia ($NH_3$) to form GaN nanorods with a diameter of 80-120 nm oriented in the c-axis direction on the substrates. Formation of the nanorods rather than a continuous epitaxial layer is a result of the low growth temperature and high V/III ratio (exceeding 60) of the active components. Unfortunately, the described method suffers from uncontrollable spontaneous distribution of the nanorods across the entire area of the substrate and from difficulty in manipulation of the diameter of nanocolumns, both of which are considered critical drawbacks for nanodevice applications.

In U.S. Pat. No. 8,338,818 a method for the formation of non-planar nanowires, nanowire arrays, and nanowire networks is described. According to the patent, the non-planar nanowires of the disclosure are described as formed in a controlled manner on surfaces having a non-planar orientation. In a described embodiment, a selective growth mask is disposed on at least two semiconductor sidewalls and a plurality of Group III-N nanowires are selectively disposed on each of the at least two semiconductor sidewalls through a selective growth mask. The formed Group III-N nanowires are oriented along a single direction on the same semiconductor sidewall and each nanowire maintains a constant cross-sectional feature, wherein adjacent Group III-N nanowires on different sidewalls of the at least two semiconductor sidewalls merge together forming one or more nanowire branches.

An evident disadvantage of the described method is that merging together separate parts of the growing crystal interface usually interferes destructively with loss of their single-crystallinity but instead form polycrystal with wide-angle grain boundaries. A yet further disadvantage of the described method is the neglect of the existing temperature dependence of the epitaxial coordination between nanowires and substrate on which they are synthesized. Previous observations show (see H. Y. Peng, N. Wang, X. T. Zhou, Y. F. Zheng, C. S. Lee, S. T. Lee, Control of growth orientation of GaN nanowires, Chemical Physics Letters 359 (2002) 241-245) that the catalyst-free GaN nanowires have a tendency to grow perpendicular to {10$\bar{1}$1} plane at temperatures between 900 and 950° C. and along [0001] direction at lower 800-900° C. temperatures. Moreover, the shape of the nanowires changes from the straight to irregular in the same temperature sequence that makes practical realization of this method questionable.

In one aspect of the present invention, a method is provided for the catalyst-free growth of uniform diameter III-Nitride nanocolumns and their ordered arrays that are free of aforementioned deficiencies found in prior art methods, including (1) non-uniform diameter nanocolumns along the predetermined crystallographic direction; (2) uncontrolled position of the nanocolumns; and, (3) temperature-dependent crystallographic orientation of the nanocolumns as is discussed in Attachment A hereto, entitled, "On the origin of the spontaneous transition to non-polar a-plane GaN growth on c-plane sapphire", V. Ivantsov et al., the entire contents of which are incorporated herein.

The position of the composite nanocolumn on the substrate of the present invention is defined by the common center of the array of the nucleation planes. Since the nanocolumn is composed of at least three symmetric sub-nanocolumns formed after twinning during coalescence, there is a preferred nucleation site at the center of each nanocolumn associated with the emerging reentrant angle. The appearance of the preferred nucleation on the top of the nanocolumn governs the direction of the highest growth rate to be aligned with the nanocolumn axis.

The axis growth velocity of the composite nanocolumn prevails over that of its side velocity, providing uniform nanocolumn diameter, not only in diffusion but also in a kinetics-limited growth mode. For the growth of nanoscale structures, including those of from III-Nitrides, nanocolumns can be produced in a much wider range of growth parameters than prior art methods were able to provide. Moreover, the direction of nanocolumn growth can be chosen from either polar or nonpolar orientations with appropriate twinning coordinations, allowing the selection. The composite nanocolumns enhance the possibilities for the development of, for instance, improved optoelectronic and high-frequency electronic devices. Additional objects and advantages of the invention are further set forth in the description that follows.

BRIEF DESCRIPTION OF THE DRAWINGS

The features and advantages of the present invention will become more apparent from the drawings and detailed description set forth below. The illustrations presented herein are not meant to be actual views of any particular semiconductor material, structure or device, but are merely illustrative representations that are employed to describe embodiments of the present invention.

DETAILED DESCRIPTION OF THE PREFERRED EMBODIMENTS

A method for growing strongly-aligned uniform cross-section semiconductor composite nanocolumns on a substrate is disclosed. The method may comprise (a) forming one or more faceted pyramidal pits or recesses on a substrate surface; (b) initiating nucleation on the facets of the pits; and, (c) promoting the growth of nuclei toward the center of the pits whereby they coalesce with twinning and grow together as one or more composite nanocolumns. Desirably, multi-quantum-well, core-shell nanocolumn heterostructures may be grown on the top or sidewalls of the nanocolumns. A continuous semiconductor epitaxial layer may be formed through the overgrowth of the nanocolumns to facilitate the fabrication of the high-quality planar device structures. The nanocolumns of the invention may be used, for instance, as elements in a light emitting structure or as compliant inserts for mitigating stress and defect density in continuous epitaxial layers that may be grown on them.

In a preferred embodiment, the composite III-Nitride nanocolumns of this invention are described as grown using hydride vapor phase epitaxy (HVPE) but may also be formed using metalorganic chemical vapor deposition (MOCVD), molecular beam epitaxy (MBE) or similar processes. Nanocolumn growth may be performed in a horizontal tube quartz reactor heated by a multi-zone resistive furnace. Although a horizontal reactor is preferred as it easily accommodates the required component sources, it is understood that implementation of the invention is not limited to a particular reactor configuration and other configurations that offer required control over temperature, gas flow and substrate location may also be used. While the reactor tube preferably has a cylindrical shape, other reactor configurations such as a rectangular cross-section may also be used.

Figure 1:
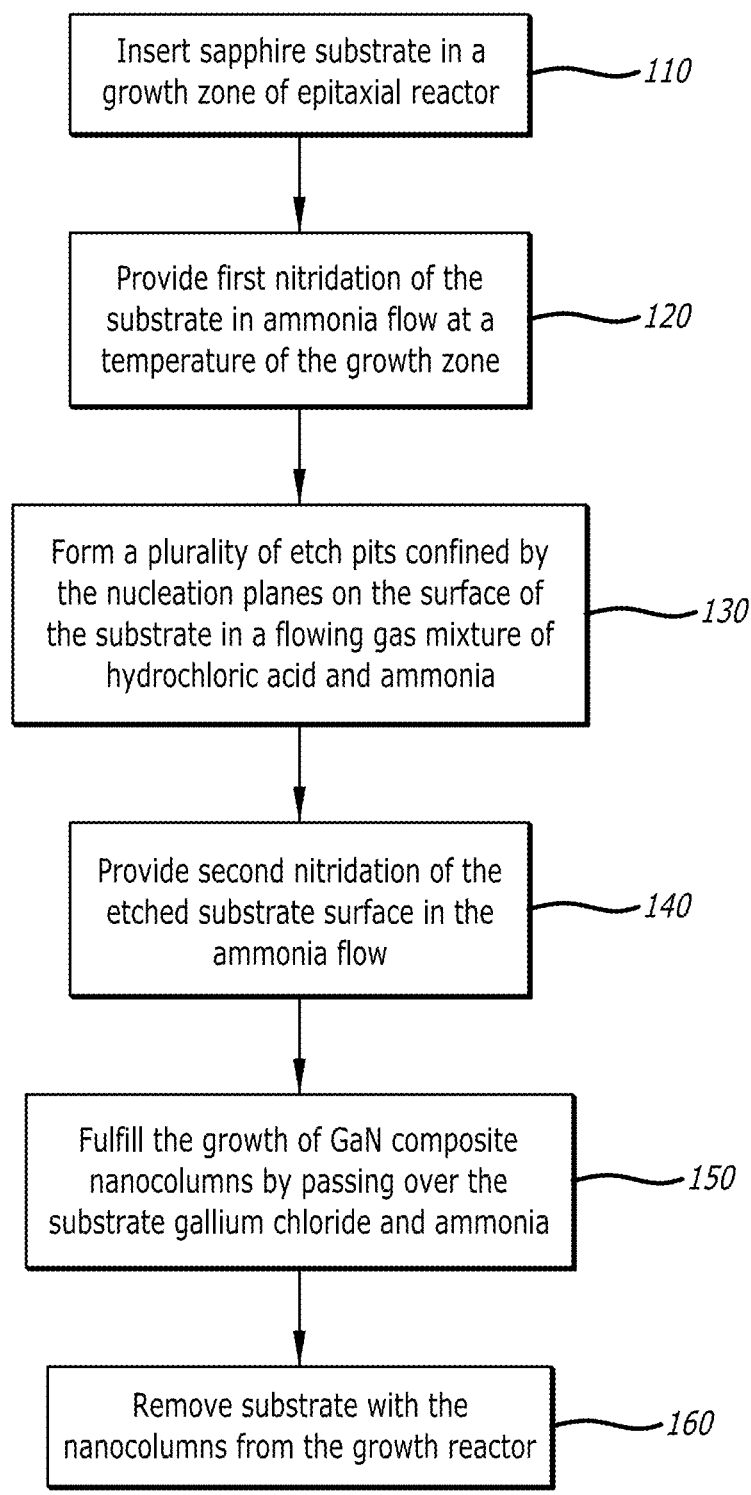
FIG. 1 is a flowchart presenting a method for producing composite a-plane GaN nanocolumns on c-plane sapphire substrate, according to one or more of the embodiments of the present invention.

The flowchart of FIG. 1 generally illustrates a preferred method for producing composite GaN nanocolumns in an HVPE growth apparatus. Referring to FIG. 1, an epi-ready substrate, for example sapphire, is inserted into the growth zone of the epitaxial reactor (110). The substrate orientation preferably coincides with or lies vicinal to the (0001) plane of sapphire. In a following step, a first nitridation of the substrate in an ammonia ($NH_3$) gas flow at a temperature of the growth zone is performed (120). The flow of ammonia preferably ranges from about ~0.5 to about ~20 standard liters per minute (slm), depending on reactor geometry. The temperature of the growth zone may be in the range of about 900° C. to about 1100° C. as determined to be optimal for the growth of GaN via HVPE chemistry.

The first nitridation may last from about four to about 90 minutes as needed for diffusion and surface reaction of the active nitrogen ions and sapphire. During FIG. 1 flowchart step 130, the inclined {10$\bar{1}$2} nucleation planes (r-planes) for the growth of sub-nanocolumns emerge due to the in situ etching of the (0001) sapphire surface with a gas mixture of hydrogen chloride (HCl) and ammonia. The pyramidal {10$\bar{1}$2} sapphire nucleation planes are bound and produce triangular etch pits where growth of the {11$\bar{2}$0} a-plane GaN sub-nanocolumns begins.

The development of the r-plane sapphire facetted etch pits may be performed not only in situ as described herein but ex situ using either or both dry and wet etching. In either case, the diameter of the etch pits defines the distance between sub-nanocolumns and, subsequently, the diameter of the resultant composite nanocolumns.

Step 140 of FIG. 1 provides about a 10-min long secondary nitridation of the etched substrate in the ammonia flow, with the gas flow and temperature parameters similar to those of the first nitridation.

The growth of GaN sub-nanocolumns and composite nanocolumns is fulfilled during step 150 of FIG. 1 by passing gallium chloride and ammonia over the substrate.

The process is ceased by removing the substrate with the nanocolumns from the growth reactor (160).

Figure 2:
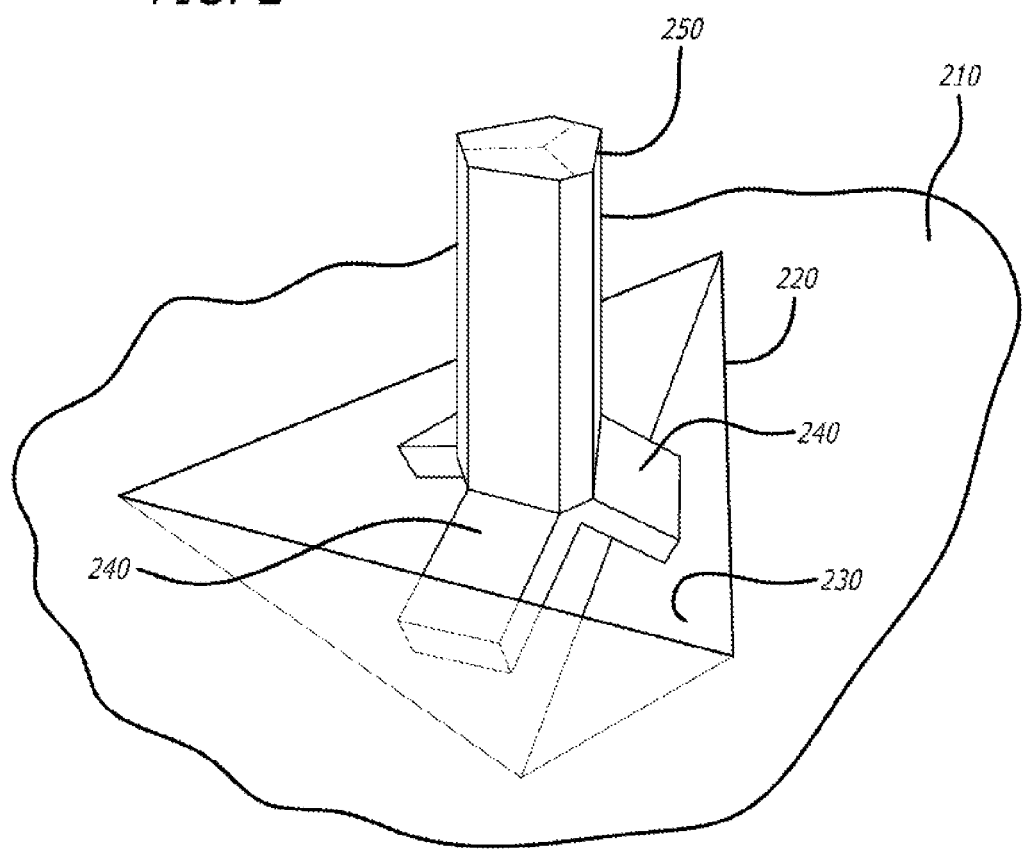
FIG. 2 is a perspective view of a structure showing the formation of a composite nanocolumn 250 from three branches 240 that advance from the side walls 230 of a pit 220 etched in a substrate 210 and merged together with twinning.

Further description of the nanocolumn formation of the invention is provided in FIG. 2. Etch pit 220 is formed on the c-plane sapphire substrate 210 and is facetted with the three r-planes 230. The r-plane of sapphire is a nucleation location for a-plane GaN. The three a-plane GaN sub-nanocolumns 240 join each other along with {10$\bar{1}$3} twinning and advance vertically as an a-plane composite nanocolumn 250 consisting of three 120 deg. rotated domains. The six sidewalls of the composite nanocolumn lie parallel to the three pairs of +c and −c planes of GaN. Due to their lower thermal stability at high growth temperature, −c-planes can be overgrown by stable +c planes, yielding a habit with the triangular cross-section confined by +c-planes only.

Figure 3:
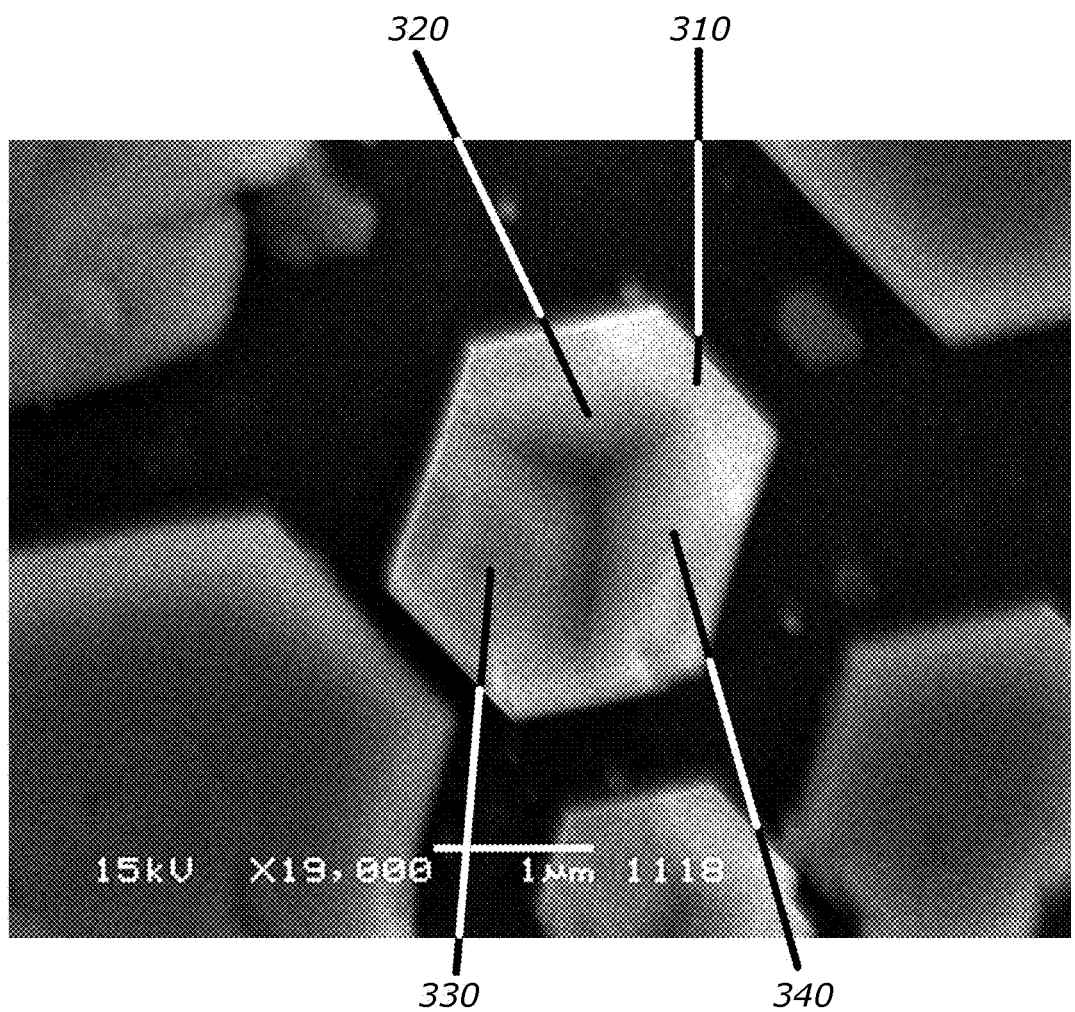
FIG. 3 is a top-view SEM image of a composite a-plane GaN nanocolumn 310 of the invention grown by HVPE and composed of three 320, 330 and 340 adjacent a-plane GaN nanocolumns.

Referring now to FIG. 3, further details of the composite nanocolumn structure of the invention are seen in the top-view SEM image. The HVPE growth of the composite a-plane nanocolumn 310 is conducted from the in situ-created etch pit on c-plane sapphire substrate. The nanocolumn is composed of three, 320, 330, and 340, adjacent a-plane GaN sub-nanocolumns. Since nanocolumn 310 is evolved out of the r-plane facetted sapphire etch pit, the position of its side walls is defined by the orientation of the etch pit on the substrate surface.

Figure 4:
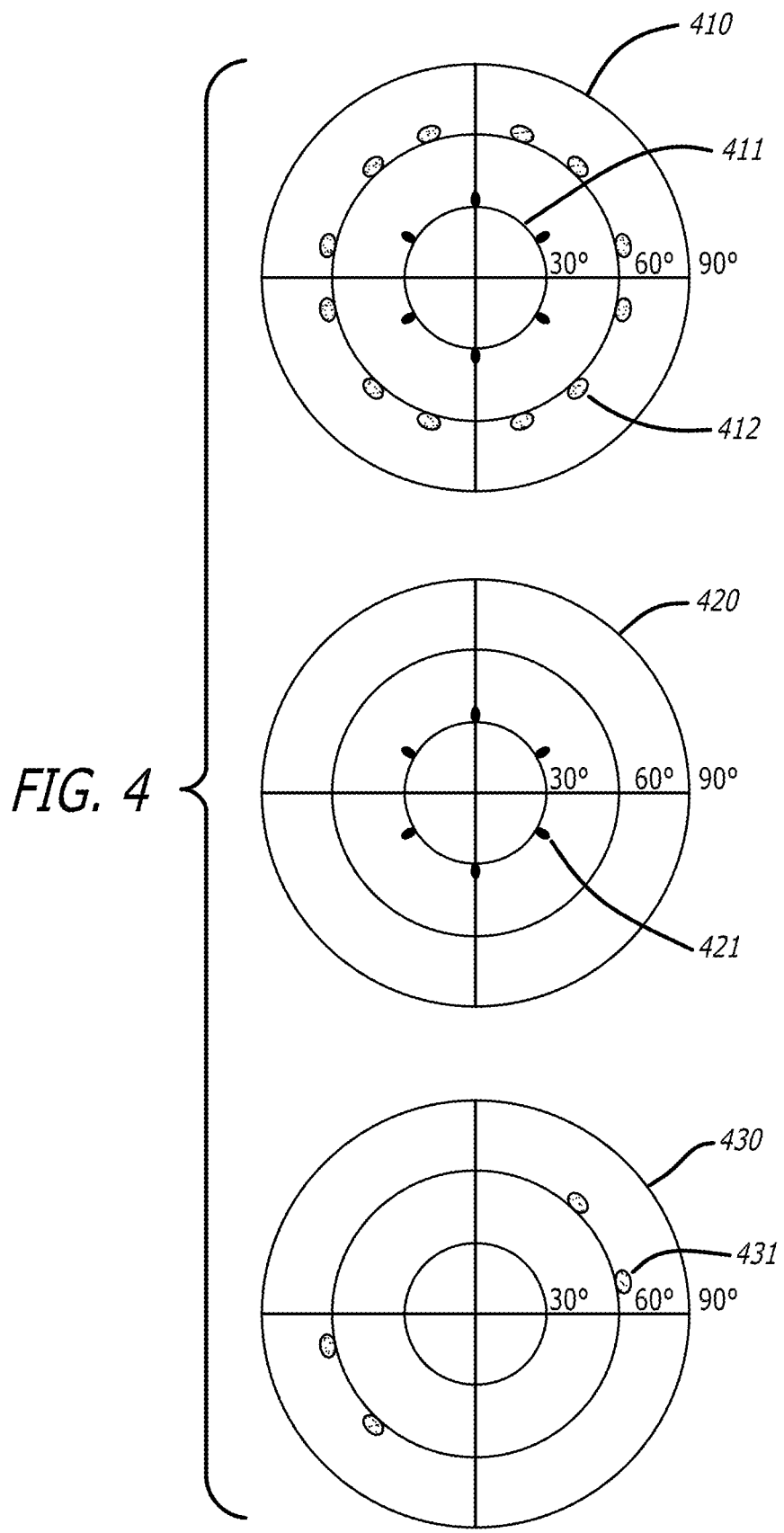
FIG. 4 is a XRD pole figure of the {10$\bar{1}$3} GaN reflexes 410 grown on c-plane sapphire according to the invention, including composite GaN nanocolumns 412 surrounded by a c-plane epitaxial layer 411. To simplify description of the pole-figure 410, the pole figures of the {10$\bar{1}$3} reflexes 421 for c-plane epitaxial layers on c-plane sapphire 420 and a-plane epitaxial layer 431 on r-plane sapphire 430 are shown.

Mutual orientation of the nanocolumns and epilayer as the composite structure of the nanocolumns is more fully described by referring to FIG. 4. The pole figure of the {10$\bar{1}$3} XRD reflex in FIG. 4 is taken from the composite a-plane nanocolumns and surrounding c-plane GaN epilayer and is represented by plot 410. To simplify understanding of the illustrated pole figure, two corresponding {10$\bar{1}$3} pole figures measured for pure c-plane and pure a-plane GaN are shown in 420 and 430, respectively. It is seen that pole-figure 410 of the composite nanocolumns and epilayer can be comprised of one related to c-plane epilayer 420 together with three 120 deg.-rotated a-plane pole-figures 430. Each of the three a-plane pole figures can be ascribed to one of the a-plane sub-nanocolumns. They are turned by about 30 deg. as compared to the epilayer since the orientation of the latter is defined by the epitaxial relation to the substrate whereas the orientation of the former is due to the etch pit orientation.

Figure 5:
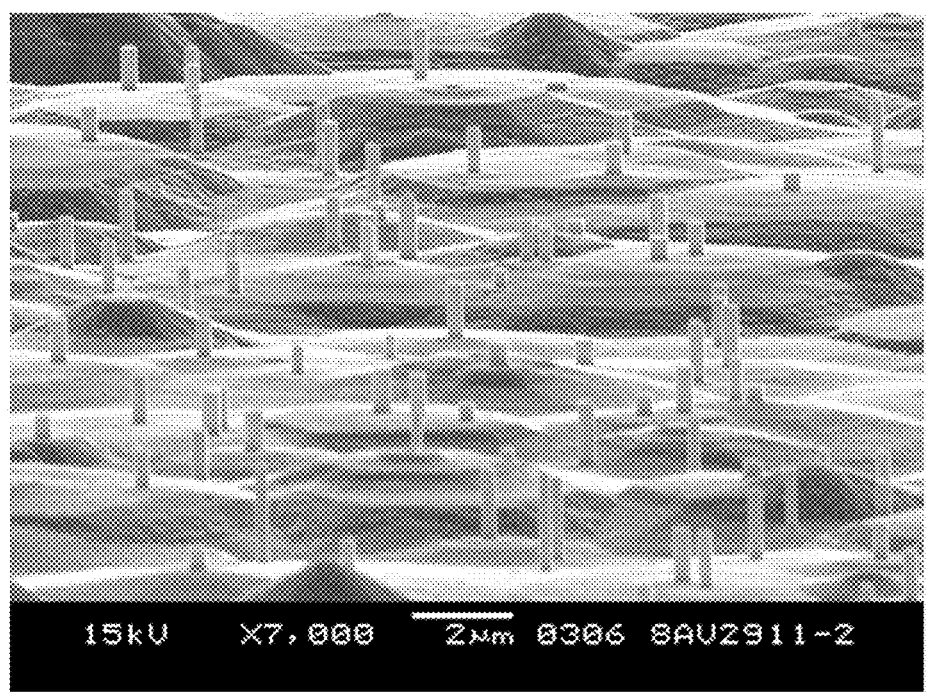
FIG. 5 is a SEM image of GaN composite nanocolumns grown according to the present method of the invention. The orientation of the nanocolumns corresponds to a-plane GaN. C-plane sapphire is used as a substrate. The undulating epitaxial layer surrounding the nanocolumns is c-plane GaN.

Referring to FIG. 5, a further SEM image of the GaN composite nanocolumns grown according to the present invention is shown. As described above, the orientation of the nanocolumns corresponds to a-plane GaN growing perpendicular to the c-plane sapphire substrate. The non-planar GaN epilayer surrounding the nanocolumns is oriented along the c-axis and is grown concurrently with the nanocolumns.

Figure 6:
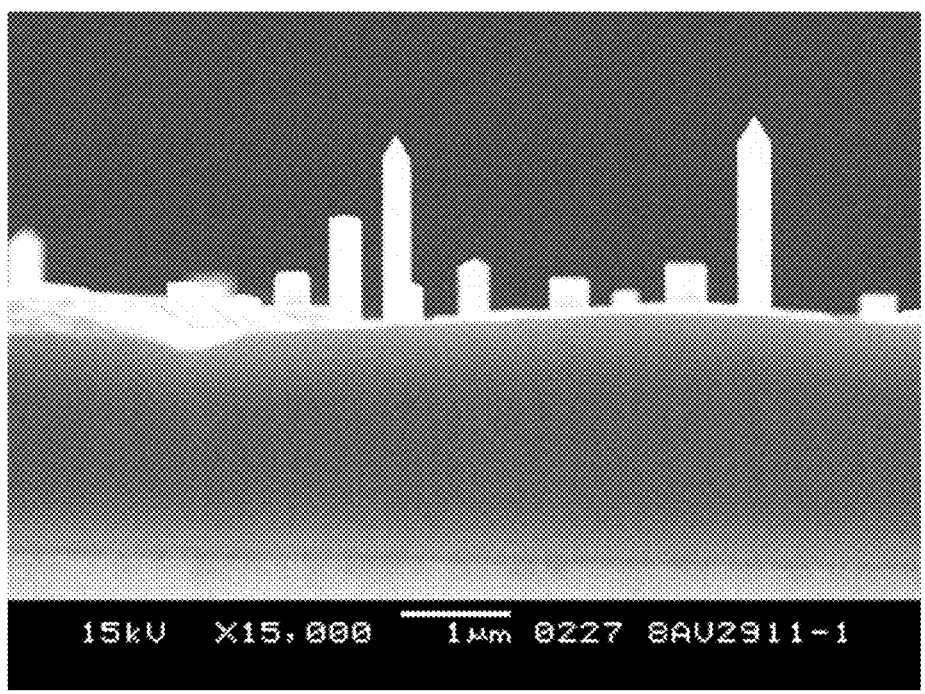
FIG. 6 is a cross-sectional SEM image of the GaN composite nanocolumns of the invention. The height of the nanocolumns depends inversely on their diameter and is defined by the diameter of the etch pit where the nano-branches are developed.

Referring to FIG. 6, a side-view SEM image of the GaN composite nanocolumns of the invention along with surrounding epilayer is shown. The height of the nanocolumns depends inversely on their diameter, which in turn is determined by the diameter of the etch pits in which they originate.

In an alternative preferred embodiment of the invention, composite nanocolumns on a surface of two-inch c-plane sapphire substrate may be used as nucleation sites for epitaxial lateral overgrowth with a continuous GaN epilayer. Nanocolumns may be grown through regularly-spaced openings etched in a substrate surface mask.

In this embodiment, first, an about ~50 nm thick $SiO_2$ mask may be deposited on a substrate using, for instance, a remote plasma enhanced chemical vapor deposition (PECVD) technique.

Second, standard photolithography using $SF_6$ and Ar reactive ion etching (RIE) may be performed to fabricate, in this exemplar embodiment, about a four μm diameter and about a five μm spacing hole pattern in the mask.

Third, wet etching of the exposed mask openings on the sapphire surface may be performed using an $H_3PO_4$-based solution at an etching temperature of about 300-400° C. and etching time of about 120-140 s.

After etching, triangular shaped etch pits with flat r-plane faceting are formed at the bottom of the openings in a lattice structure.

Finally, GaN growth may be initiated using HVPE as earlier described and continued until composite nanocolumns emerge from the mask openings extending about 3-5 μm above their upper edge.

It is noted that an increase in gallium chloride and ammonia flow in the process of the invention leads to an increase of the GaN growth rate. The V/III ratio during mask overgrowth is preferably set between about 30 and about 35. Because of sidewall inaccessibility, the GaN overgrowth proceeds only from the top (or top facet) of the nanocolumns. As a result, the nanocolumns merge with each other and become a fully coalesced GaN film. The coalescence process can be completed within the film thickness of about 10 μm. The film is suspended on the nanocolumns and can be detached in order to make free-standing GaN crystal if its thickness is sufficient enough to avoid cracks. Crack-free material can be obtained starting from about a ~100 μm thickness.

Figure 7:
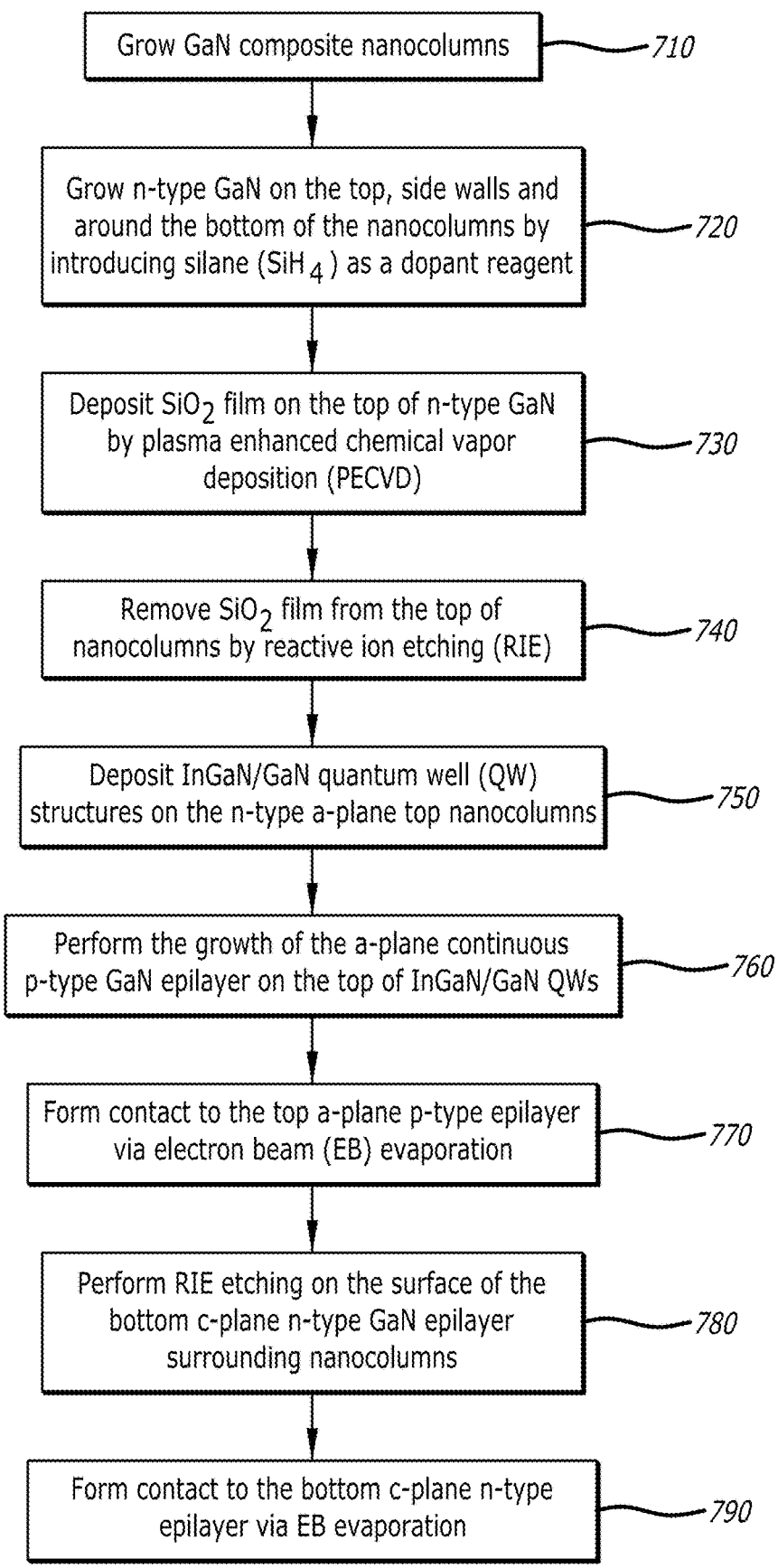
FIG. 7 is a flowchart presenting a procedure for producing light emitting structures such as a light emitting diode structure or a laser diode structure using composite a-plane GaN nanocolumns on c-plane sapphire substrate, according to the embodiment of the present invention.
Figure 8:
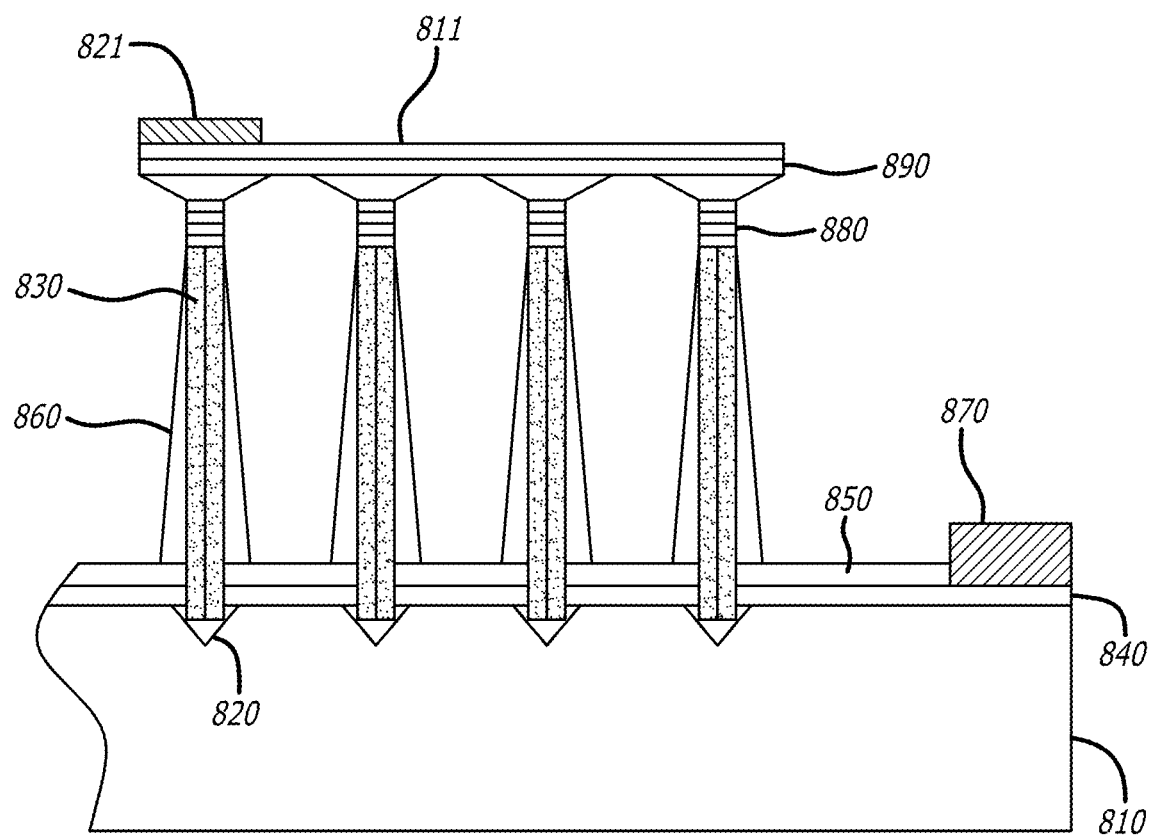
FIG. 8 is a schematic diagram of the composite nanocolumn light emitting structure.

In a yet further preferred embodiment depicted in FIG. 7 and FIG. 8, a light emitting structure such as a light emitting diode (LED) may be grown on the composite GaN nanocolumns.

A preferred set of method steps for the fabrication of a light emitting structure using the nanocolumns of the invention is illustrated in the process flow chart of FIG. 7. First, GaN composite nanocolumns are grown as described earlier in this specification (710). Following nanocolumn fabrication, n-type GaN is grown on the top, side walls and around the bottom of the nanocolumns by introducing silane ($SiH_4$) as a dopant reagent (720). An $SiO_2$ film is then deposited on the top of n-type GaN such as by plasma enhanced chemical vapor deposition (PECVD) (730). The $SiO_2$ film is removed from the top of nanocolumns such as by reactive ion etching (RIE) (740). Next, InGaN/GaN quantum well (QW) structures are formed on the top of the n-type a-plane top nanocolumns (750) and an a-plane continuous p-type GaN epilayer is grown on the top of InGaN/GaN QWs (760). Next, contacts are formed to the top a-plane p-type epilayer such as by electron beam (EB) evaporation (770). An RIE etch is then performed on the surface of the bottom c-plane n-type GaN epilayer surrounding nanocolumns (780) and contacts formed to the bottom c-plane n-type epilayer such as by EB evaporation (790).

The nanocolumns are grown as described above using etch pits 820 in a sapphire substrate 810 having a c-plane GaN layer 840 thereon. In this LED embodiment, during the growth step, silane ($SiH_4$) may be introduced in the gas flow stream to add a silicon impurity, facilitating n-type conduction in the nanocolumns and adjacent epilayer or epilayers.

An about 20-nm thick $SiO_2$ film 850 may then be deposited on the nanocolumns and epilayer by the PECVD technique as described above and a reactive ion etch or "RIE" may be performed. Because the etching rate of the RIE is dependent on the direction of the ion beam towards the substrate, the vertical etching rate is faster than the horizontal one. A user can thus control the RIE parameters in order to remove the $SiO_2$ on the top of the a-plane composite nanocolumns and simultaneously leave residual $SiO_2$ 860 on the sidewalls of the nanocolumns, making the sidewalls passivated with a 10-nm thick $SiO_2$ film. The top of the nanocolumns 830 thus exhibit an oxide-free, composite a-plane surface that is suitable for subsequent regrowth of light-emitting epitaxial layers. In FIG. 8, it is assumed that the substrate area is masked, so oxide layer 850 will remain.

In a subsequent step, the grown template possessing nanocolumns is transferred to an MOCVD growth reactor where InGaN/GaN quantum well structures 880 are deposited on the top of the n-type nanocolumns using, for instance, trimethylgallium, $Ga(CH_3)_3$, trimethylindium, $In(CH_3)_3$, and ammonia ($NH_3$) as gas carriers. An n-pad 870 may be provided on the c-plane n-type GaN layer 840. The light emitting structure may also be formed as an InGaN/GaN multilayer quantum well structure. A reflective film may also be optionally formed on the n-type semiconductor layer.

Further growth may be performed with bis(cyclopentadienyl)magnesium ($Cp_2Mg$) to produce a top a-plane p-type conductive epilayer. During the growth of p-type GaN, the flow rate of the ammonia and trimethylgallium along with the carrier gas(es) may be gradually increased to widen the diameter of the nanocolumns and eventually merge them and form a planar a-plane p-type GaN epilayer 890.

Thereafter, a Ni/indium tin oxide (ITO) may be formed as a transparent electrode on the surface of the p-type epilayer by, for instance, vapor deposition in an electron beam (EB) vapor deposition apparatus. An Au p-type electrode may be formed on the transparent electrode to form the p-pad 821.

Similarly, the Ti/Au or other suitable n-type electrode may be formed by vapor deposition in an EB vapor deposition apparatus on the RIE etched surface of n-type GaN epilayer to form the n-type contact 850 in order to complete the light-emitting diode (LED) structure. GaN and AlGaN photodetector structures as well as composite nanocolumns field emission structures and power devices may similarly be formed.

The formed LED structure comprises the n-type electrode (first electrode) 850 attached to the surface of the n-type GaN epilayer; a plurality of a-plane n-type GaN composite nanocolumns 830 with sequential stacking of InGaN/GaN light-emitting structures (nanocolumn LED) on the top of the nanocolumns 830 in turn surrounded by the epilayer; the p-type continuous GaN epilayer and the p-type electrode or pad (second electrode) 821 formed on the surface of the transparent electrode 811.

Thus the LED structure of FIG. 8 is an embodiment of a method to form an a-plane non-polar GaN LED structure starting the epitaxial growth process on c-plane polar GaN 850. This method overcomes the difficulties typically encountered in the epitaxial growth of non-polar GaN on r-plane sapphire, including but not limited to stress management and dislocation formation at the r-plane sapphire/a-plane GaN interface. It is thus possible to use well understood and reliable growth on c-plane sapphire to realize an a-plane LED structure having the advantages that could be realized by such a crystalline plane such as lower strain, markedly lower threading dislocation densities, higher efficiency and more potentially higher indium intake ratio in the InGaN QWs of the a-plane LED structure. As a result the embodiment of FIG. 8 enables the realization of $In_xGa_{(1-x)}N$ QW LED structure with sufficiently high In ratio x to realize long visible spectrum wavelength such as Red 650-nm, which is very highly sought after in display applications.

One skilled in the art will recognize that the lateral coalescence of the GaN between the nanocolumns as illustrated in block 890 of FIG. 8 could occur, possibly with n-type or undoped GaN instead of p-type GaN, prior to the growth of the light emitting structures. Such a reversal of the growth order could be used to grow relaxed planar light emitting diodes and laser diodes that take advantage of the low stress and defect densities in the resultant material. Such structures could be further readily bonded to carrier wafers or submounts for packaging in thin film light emitter structures.

While the LED implementations described above utilized epitaxial growth on the top surfaces of the nanocolumns, one skilled in the art will recognize that it is also possible to instead mask the top surface of the nanocolumns and grow the light emitting structures on the vertical sidewalls. Such an approach could provide advantages for the fabrication of edge-emitting laser diodes, for example. Alternately, light emitting layers could be grown on both the sidewalls and the top surfaces. In this case, the growth process could be tailored to vary the indium incorporation rate on the two distinct crystallographic planes, yielding different emission wavelengths from the top surfaces and sides of the nanocolumns, respectively. Such color mixing could provide distinct advantages in the fabrication of high-efficiency white LEDs for illumination and display applications. Also in many instances herein, the structures created have been described in the context of LEDs, though many of the structures are, or could easily be modified by one of reasonable skill in the art to be, laser structures and readily used as laser diodes. Accordingly as used herein, there is a correspondence between LEDs and laser diodes, which are collectively referred to as light emitting structures.

In the foregoing disclosure, c-plane sapphire was used as the exemplary substrate material, though c-plane sapphire is exemplary only, as various other substrate materials might also be used, such as c-plane sapphire GaN, silicon carbide, silicon, a-plane sapphire, lithium aluminate or spinel materials, to name a few such other materials. In that regard, the invention may be practiced using substrate materials that would not be considered traditional substrate materials for GaN growth because of the adverse results from the lattice mismatch, as the normal size of a pyramidal pit in a lateral direction, preferably in the range of 10 nanometers to 50 microns, and more preferably less than a micron, avoids the accumulation of the lattice mismatch that would be encountered if a uniform layer of GaN was to be grown. Further in the foregoing disclosure, the GaN was used as the exemplary material of the nanocolumns and sub-nanocolumns. However other materials might also be used, including AlN, AlGaN, InGaN, AlInN or AlInGaN.

While the invention is illustrated with respect to the selected implementations, alterations and modifications can be made to the illustrated examples without departing from the spirit and scope of the appended claims. In addition, while the particular features of the invention may have been disclosed with respect to only several implementations, such features may be combined with one or more other features as may be desired and advantageous for any given or particular function.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for growing a composite nanocolumn comprising:
    forming a three-faceted tetrahedron-shaped pit below a surface of a sapphire substrate wherein each facet comprises an exposed surface of a respective r-plane of the sapphire substrate;
    initiating an a-plane GaN sub-nanocolumn nucleation on each facet;
    promoting a growth of an a-plane GaN sub-nanocolumn on each facet toward a center of the three-facet tetrahedron-shaped pit whereby the a-plane GaN sub-nanocolumns coalesce to form an a-plane composite nanocolumn.

2. The method according to claim 1, wherein the three-faceted tetrahedron-shaped pit is formed by wet chemical etching in a $H_3PO_4$ based solution.

3. The method according to claim 2, wherein the a-plane GaN sub-nanocolumns and a-plane composite nanocolumn have a non-polar a-plane orientation.

4. The method according to claim 1, wherein a size of the three-faceted tetrahedron-shaped pit in a lateral dimension is sub-micron.

5. The method according to claim 1, wherein a size of the three-faceted tetrahedron-shaped pit in a lateral dimension is in a range of 10 nanometers to 50 microns.

6. The method according to claim 1, further comprised of a plurality of three-faceted tetrahedron-shaped pits and wherein the three-faceted tetrahedron-shaped pits are formed using a mask on the surface of the sapphire substrate to create a two-dimensional lattice pattern of three-faceted tetrahedron-shaped pits on the surface of the sapphire substrate.

7. The method according to claim 6, wherein the a-plane GaN sub-nanocolumns and a-plane composite nanocolumn have a non-polar a-plane orientation.

8. The method according to claim 6, wherein the a-plane sub-nanocolumns and a-plane composite nanocolumn are grown by hydride vapor phase epitaxy techniques.

9. The method according to claim 1, wherein the a-plane composite nanocolumn comprises a Group III-nitride semiconductor material.

10. The method according to claim 1, wherein the sapphire substrate is a c-plane sapphire substrate.

11. The method according to claim 1, wherein the sapphire substrate is a c-plane sapphire substrate and a facet of the faceted pyramidal pit is parallel to an r-plane of the c-plane sapphire substrate.

12. The method according to claim 1, wherein the pit is a three-faceted tetrahedron-shaped pit and the three-faceted tetrahedron-shaped pit is formed by etching the substrate in a gas mixture containing HCl.

13. The method according to claim 12, wherein the substrate is a c-plane sapphire substrate and wherein a facet of the three-faceted tetrahedron-shaped pit is parallel to an r-plane of the c-plane sapphire substrate.

14. The method according to claim 1, wherein the method further comprises growing a composite nanocolumn multilayer GaN and InGaN light emitting structure.

15. The method according to claim 1, wherein the method further comprises growing a composite nanocolumn multilayer GaN and InGaN light emitting structure on the top of the composite nanocolumn.

16. The method according to claim 1, wherein the method further comprises growing a composite nanocolumn multilayer GaN and InGaN light emitting structure on the sides of the a-plane composite nanocolumn.

17. The method according to claim 1, wherein the method further comprises growing a composite nanocolumn multilayer GaN and AlGaN photodetector structure on the a-plane composite nanocolumn.

18. The method according to claim 1, wherein the method further comprises growing a composite nanocolumn multilayer GaN and AlGaN photodetector structure on top of the a-plane composite nanocolumn.

19. The method according to claim 1, wherein the method further comprises growing a composite nanocolumn multilayer GaN and AlGaN photodetector structure on sides of the a-plane composite nanocolumn.

20. The method according to claim 1, wherein the method further comprises growing a composite nanocolumn field emission structure on the a-plane composite nanocolumn.

21. The method according to claim 1, wherein the method further comprises growing a power device on the a-plane composite nanocolumn.

22. The method according to claim 1 further comprising growing composite nanocolumn multilayer GaN and InGaN light emitting structures on the a-plane composite nanocolumn wherein the light emitting structures emit different wavelengths based on crystallographic facets on which they are grown on the a-plane composite nanocolumn.

* * * * *